(12) United States Patent
Abe et al.

(10) Patent No.: US 10,931,908 B2
(45) Date of Patent: Feb. 23, 2021

(54) SOLID-STATE IMAGING DEVICE, AND CAMERA SYSTEM USING SAME

(71) Applicant: Panasonic Intellectual Property Management Co., Ltd., Osaka (JP)

(72) Inventors: Yutaka Abe, Osaka (JP); Kazuko Nishimura, Kyoto (JP); Hiroshi Fujinaka, Osaka (JP); Norihiko Sumitani, Osaka (JP); Yosuke Higashi, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 64 days.

(21) Appl. No.: 16/491,123

(22) PCT Filed: Feb. 27, 2018

(86) PCT No.: PCT/JP2018/007107
§ 371 (c)(1),
(2) Date: Sep. 4, 2019

(87) PCT Pub. No.: WO2018/163896
PCT Pub. Date: Sep. 13, 2018

(65) Prior Publication Data
US 2020/0014873 A1    Jan. 9, 2020

Related U.S. Application Data

(60) Provisional application No. 62/468,551, filed on Mar. 8, 2017.

(51) Int. Cl.
*H03K 5/24* (2006.01)
*H01L 27/30* (2006.01)
(Continued)

(52) U.S. Cl.
CPC ......... *H04N 5/378* (2013.01); *H03F 3/45242* (2013.01); *H03K 3/356104* (2013.01);
(Continued)

(58) Field of Classification Search
None
See application file for complete search history.

(56) References Cited

U.S. PATENT DOCUMENTS 8,797,410 B2 * 8/2014 Yoshida ................. H04N 5/378
348/175
2013/0341489 A1   12/2013 Yoshida

FOREIGN PATENT DOCUMENTS

JP    2014-007527 A    1/2014

OTHER PUBLICATIONS

International Search Report and Written Opinion issued in corresponding International Patent Application No. PCT/JP2018/007107, dated Jun. 5, 2018, with partial translation.

* cited by examiner

*Primary Examiner* — Mark T Monk
(74) *Attorney, Agent, or Firm* — McDermott Will & Emery LLP

(57) ABSTRACT

A solid-state imaging device includes a first A/D converter circuit and a second A/D converter circuit per column. The first A/D converter circuit performs a first A/D conversion that (i) refines, using a first comparator, a range including a potential of an analog signal through a binary search, and (ii) generates, based on a result of the binary search, a first digital signal being a high-order portion of the digital signal. The second A/D converter circuit performs a second A/D conversion that generates a second digital signal being a low-order portion that is a remainder of the digital signal by measuring a time required for an output of the second (Continued)

comparator to be inverted, the second comparator comparing a quantitative relationship between the analog signal refined and a ramp signal.

16 Claims, 19 Drawing Sheets

(51) Int. Cl.
    *H04N 5/378*     (2011.01)
    *H03F 3/45*     (2006.01)
    *H03K 3/356*     (2006.01)
    *H03M 1/38*     (2006.01)
    *H03M 1/56*     (2006.01)

(52) U.S. Cl.
    CPC ................ *H03K 5/24* (2013.01); *H03M 1/38* (2013.01); *H03M 1/56* (2013.01); *H01L 27/307* (2013.01)

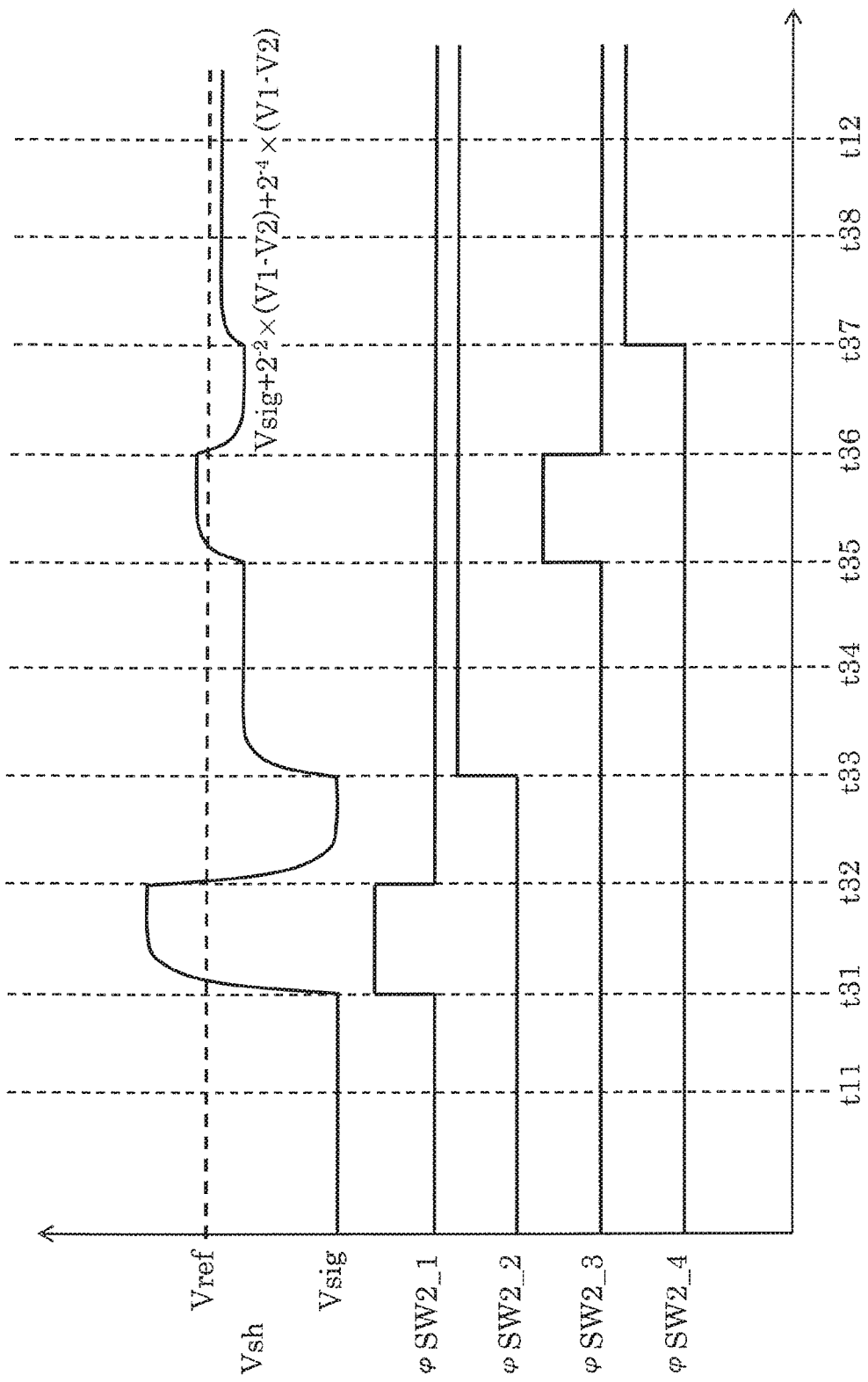

SOLID-STATE IMAGING DEVICE, AND CAMERA SYSTEM USING SAME

CROSS-REFERENCE OF RELATED APPLICATIONS

This application is the U.S. National Phase under 35 U.S.C. § 371 of International Patent Application No. PCT/JP2018/007107, filed on Feb. 27, 2018, which in turn claims the benefit of U.S. Application No. 62/468,551, filed on Mar. 8, 2017, the entire disclosures of which Applications are incorporated by reference herein.

TECHNICAL FIELD

The present disclosure relates to a solid-state imaging device and a camera system using the same.

BACKGROUND ART

In metal-oxide-semiconductor (MOS) image sensors that are capable of having a mix of peripheral circuits on a single chip, and especially in image sensors with a high number of pixels, a column analog-to-digital (A/D) conversion method is commonplace that simultaneously A/D converts a pixel output signal per pixel row.

In recent years, with the further advancement of frame rates and digital output data bitrates in solid-state imaging devices, A/D convertor circuits are being proposed that have a configuration in which different A/D conversion methods are used for high-order bits and low-order bits in order to perform a high-speed and high-resolution A/D conversion.

To give an example, Patent Literature (PTL) 1 discloses a column A/D convertor circuit that digitally converts high-order bits using a successive approximation A/D conversion method and digitally converts low-order bits using a single slope A/D conversion method.

CITATION LIST

Patent Literature

PTL 1: Japanese Unexamined Patent Application Publication No. 2014-007527.

SUMMARY OF THE INVENTION

Technical Problems

A/D conversion of high-order bits is performed using successive approximation A/D conversion (hereafter referred to as SAR conversion), A/D conversion of low-order bits is performed using single slope A/D conversion (hereafter referred to as SS conversion), and in this SAR+SS A/D conversion, a binary search is performed on an input signal during the SAR conversion, an analog value is refined, and the SS conversion is performed on the refined analog signal.

The conventional technique described in PTL 1 faces the problem, however, that even when noise contamination occurs during the SAR conversion, there is no influence on a final digital value by performing the SS conversion on a broader range than a refined range, but when noise contamination occur during the SS conversion, conversion errors do occur in the final digital value.

The conventional technique described in PTL 1 faces another problem that an operating frequency bandwidth needs to be reduced to a low speed when trying to limit the noise contamination during the SS conversion, and a total A/D conversion time increases without raising an operating speed of the SAR conversion.

In view of the above problem, the present disclosure aims to provide a solid-state imaging device that implements a high-speed SAR, conversion and performs a high-quality readout at a high frame rate while limiting noise contamination during the SS conversion.

Solution to Problems

In order to solve the above problem, a solid-state imaging device in an aspect of the present disclosure includes a plurality of pixel cells arranged in an X-direction and a Y-direction, the plurality of pixels cells each including a photoelectric converter that converts an optical signal to an electrical signal; a plurality of vertical signal lines arranged in the X-direction that are connected to the plurality of pixel cells and transmit the electrical signal as an analog signal; and a plurality of analog-to-digital (A/D) converters arranged in the X-direction that are respectively connected to the plurality of vertical signal lines and convert the analog signal to a digital signal. The plurality of A/D converters each include a first A/D converter circuit having a first comparator; and a second A/D converter circuit having a second comparator. The first A/D converter circuit performs a first A/D conversion that (i) refines, using the first comparator, a range including a potential of the analog signal through a binary search, and (ii) generates, based on a result of the binary search, a first digital signal being a high-order portion of the digital signal. The second A/D converter circuit performs a second A/D conversion that generates a second digital signal being a low-order portion that is a remainder of the digital signal by measuring a time required for an output of the second comparator to be inverted, the second comparator comparing a quantitative relationship between the analog signal refined and a ramp signal.

A camera system in the present disclosure includes the above solid-state imaging device.

Advantageous Effects of Invention

The present disclosure makes it possible to implement a high-speed A/D conversion and enables high-resolution imaging at a high frame rate while limiting noise.

BRIEF DESCRIPTION OF DRAWINGS

FIG. 6 is an operation timing diagram of the solid-state imaging device according to Embodiment 1.

DESCRIPTION OF EXEMPLARY EMBODIMENTS

Figure 1:
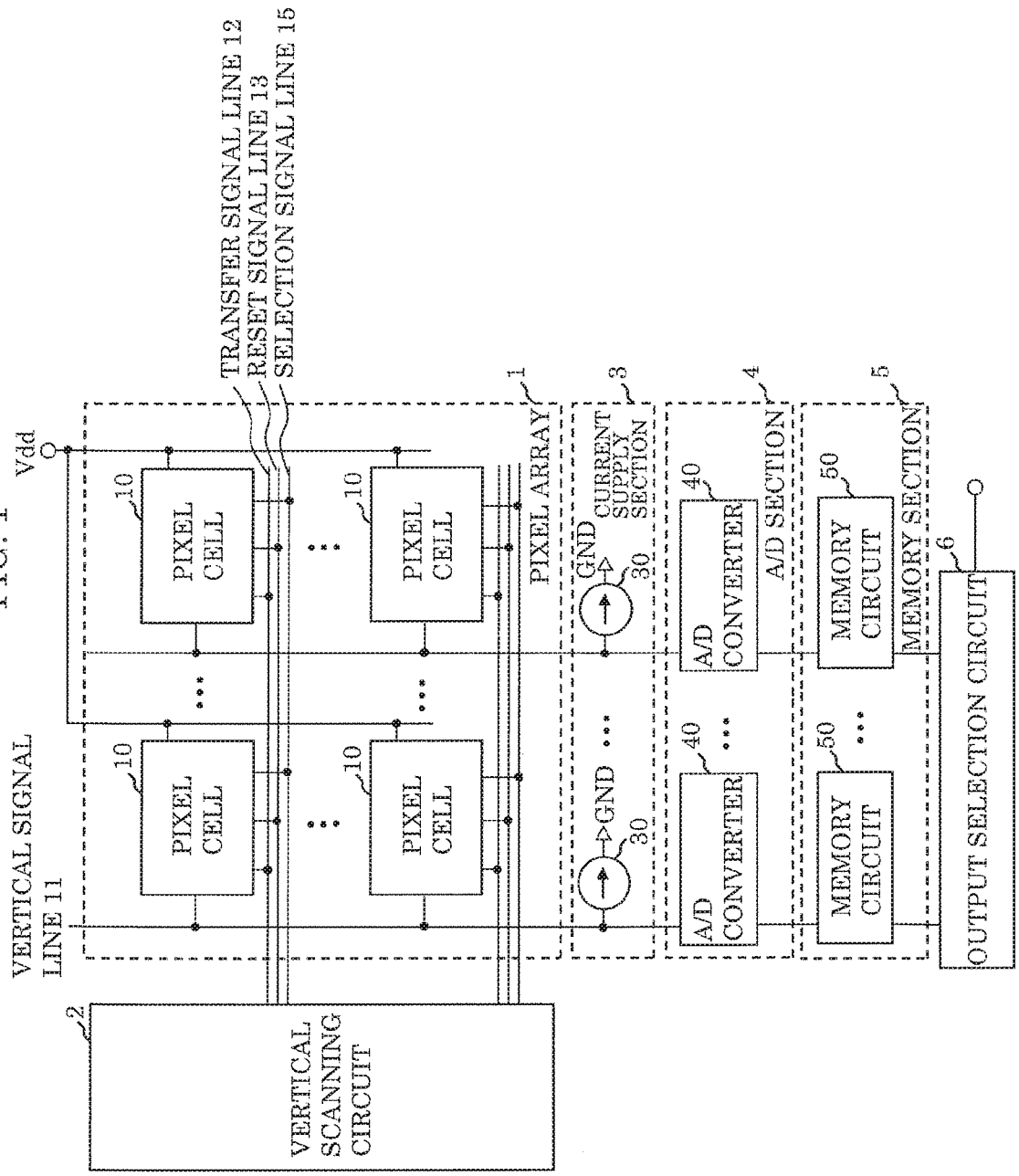
FIG. 1 is a diagram showing a configuration example of a solid-state imaging device according to Embodiment 1.

Hereinafter, embodiments in the present disclosure will be described with reference to the drawings. Note that the embodiments described below each show a specific example in the present disclosure. Numerical values, shapes, materials, components, placement and connection of the components, operation timing, and the like are mere examples and are not intended to limit the present disclosure. Components in the following embodiments not mentioned in any of the independent claims that define the broadest concepts are described as optional elements. The drawings do not necessarily provide strictly accurate illustrations. In the drawings, overlapping descriptions of components that are substantially the same as components described previous thereto are omitted or simplified.

Embodiment 1

FIG. 1 is a diagram showing an overall configuration of a solid-state imaging device according to Embodiment 1.

The solid-state imaging device in the drawing includes pixel array 1, vertical scanning circuit 2, current supply section 3, analog-to-digital (A/D) section 4, memory section 5, and output selection circuit 6.

Pixel array 1 includes pixel cells (single cells) each including a photoelectric converter that converts an optical signal to an electrical signal. Pixel cells 10 are arranged in the X-direction and the Y-direction in an array (i.e., two-dimensionally). Pixel cells 10 belonging to the same column are connected to a shared vertical signal line 11. Pixel cells 10 belonging to the same row are connected to a shared transfer signal line 12, reset signal line 13, and selection signal line 15.

Vertical scanning circuit 2 sequentially scans pixel array 1 per row unit using transfer signal line 12, reset signal line 13, and selection signal line 15.

Current supply section 3 includes multiple current supplies 30 arranged in the X-direction. Current supplies 30 each pair up with a readout transistor in pixel cell 10, which is selected through the scanning, to form a source follower circuit.

A/D section 4 includes multiple A/D converters 40 arranged in the X-direction.

Memory section 5 includes multiple memory circuits 50 arranged in the X-direction.

Output selection circuit 6 selects memory circuit 50 and outputs a digital signal per pixel cell 10.

Figure 2:
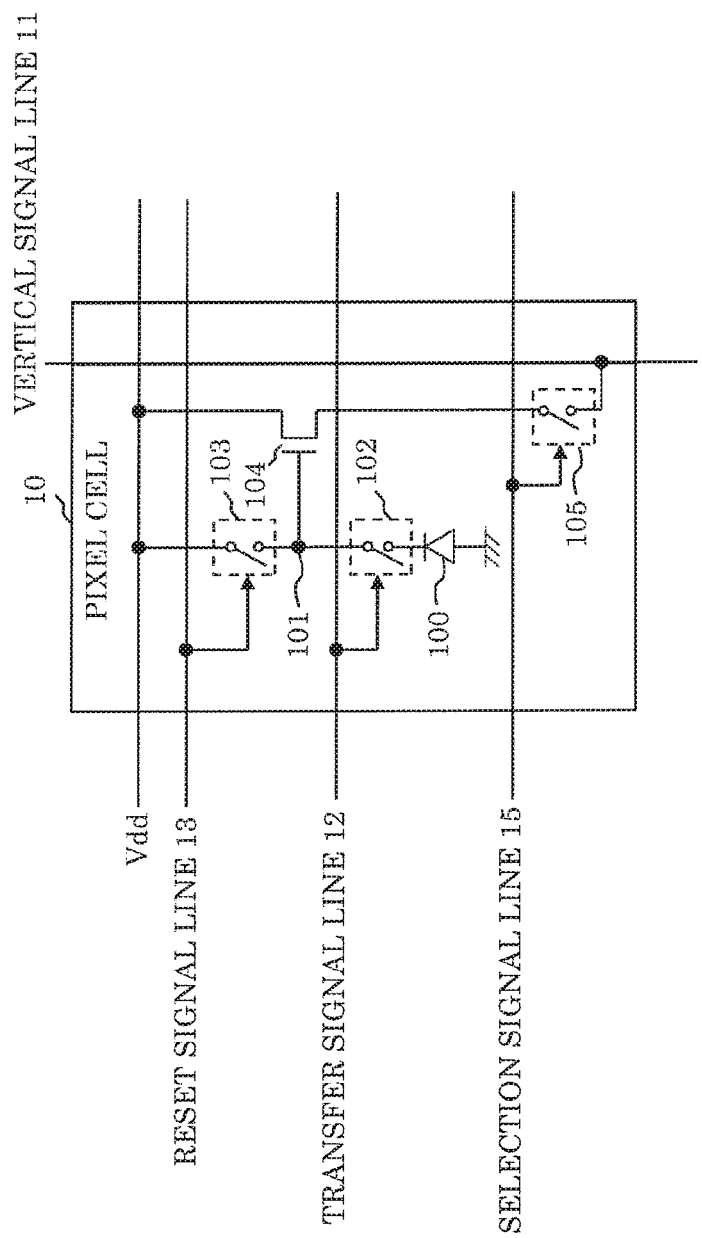
FIG. 2 is a diagram showing a configuration example of a pixel cell according to Embodiment 1.

FIG. 2 is a diagram showing a configuration example of pixel cell 10 according to Embodiment 1. Pixel cell 10 shown in FIG. 2 includes photodiode 100, floating diffuser (FD) 101, transfer transistor (transfer Tr) 102, reset transistor (reset Tr) 103, readout transistor (readout Tr) 104, and selection transistor (selection Tr) 105.

Photodiode 100 is a photoelectric conversion element (also referred to as photoelectric converter, light receiver, pixel) that converts an optical signal to an electrical signal.

Signal charge produced in photodiode 100 is transferred to FD 101 and is temporarily retained by FD 101 as an electrical signal.

Transfer transistor 102 is disposed between photodiode 100 and FD 101, and transfers the signal charge from photodiode 100 to FD 101.

Reset transistor 103 is connected to and resets FD 101.

A gate of readout transistor 104 is connected to FD 101, and readout transistor 104 outputs a potential corresponding to a potential of FD 101.

Selection transistor 105 is disposed between readout transistor 104 and vertical signal line 11, selects an output of readout transistor 104, and outputs a potential signal from pixel cell 10 to vertical signal line 11.

A gate of transfer transistor 102 is connected to transfer signal line 12, a gate of reset transistor 103 is connected to reset signal line 13, and a gate of selection transistor 105 is connected to selection signal line 15.

Vertical scanning circuit 2 is connected to transfer signal line 12, reset signal line 13, and selection signal line 15, and controls each of pixel cells 10 so that pixel cells 10 produce and output an electrical signal corresponding to the optical signal per row.

Current supply section 3 includes current supplies 30 disposed in columns. Current supplies 30 are connected to vertical signal line 11 in each column, and form the source follower circuit together with readout transistor 104 of each pixel cell in a corresponding column. The potential of FD 101 is read out to vertical signal line 11 through the formed source follower circuit.

A/D section 4 includes A/D converter 40 disposed per vertical signal line 11. A/D converter 40 is connected to vertical signal line 11, and converts the analog signal to be read out to vertical signal line 11 to a digital value.

Memory circuit 50 temporarily retains the digital signal converted in A/D converter 40.

Output selection circuit 6 sequentially selects and outputs the digital signal retained by memory circuit 50 per predetermined column.

Figure 3:
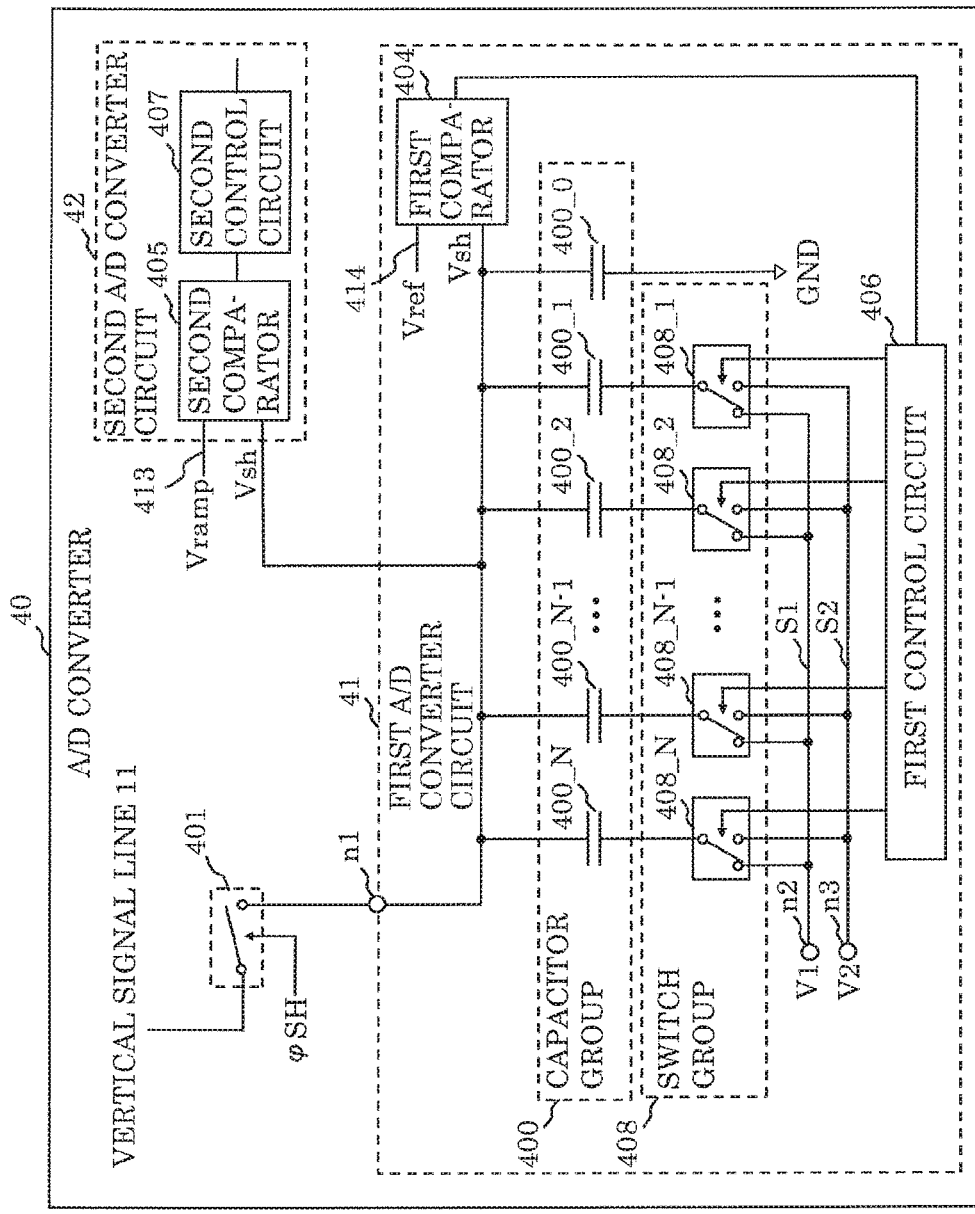
FIG. 3 is a diagram showing a configuration example of an A/D converter according to Embodiment 1.

FIG. 3 is a diagram showing a configuration example of A/D converter 40 according to the present embodiment.

A/D converter 40 shown in FIG. 3 includes first switch 401, first A/D converter circuit 41, and second A/D converter circuit 42. First A/D converter circuit 41 includes capacitor group 400, first signal line S1 having first potential V1, second signal line S2 having second potential V2, first comparator 404, first control circuit 406, and switch group 408. Capacitor group 400 includes capacitors 400_0 to 400_N (N is an integer of at least 2). Switch group 408 includes switches 408_1 to 408_N disposed to correspond to capacitors 400_1 to 400_N.

One electrode of each of capacitors 400_0 to 400_N is coupled to first node n1. Capacitors 400_0 to 400_N each have a weighted capacitance value, which is a binary weighted capacitance value of $2^0 \times C$, $2^1 \times C \ldots 2^N \times C$ (N is an integer of at least 2) in the present example, but is not necessarily limited thereto.

First switch 401 is disposed between vertical signal line 11 and first node n1, transmits the analog signal output from vertical signal line 11 to first node n1 by being turned on, and causes capacitor group 400 to retain a total charge by being turned off.

First comparator 404 is connected to first node n1, compares a quantitative relationship between potential Vsh of first node n1 and reference potential Vref of reference signal line 414, and outputs this result to first control circuit 406.

Second switches 408_1 to 408_N select either first potential V1 or second potential V2 and respectively supply it to capacitors 400_1 to 400_N in accordance with an output of first control circuit 406.

First control circuit 406 performs a control of second switches 408_1 to 408_N corresponding to an output of first comparator 404 so that a range including potential Vsh of first node n1 is refined through a binary search, and also generates a first digital signal corresponding to a result of the binary search. The first digital signal is a high-order portion of the digital signal that is converted from the analog signal of vertical signal line 11.

Second comparator 405 is connected to first node n1, compares a quantitative relationship between potential Vsh of first node n1 and a potential of ramp signal 413, and outputs this result to second control circuit 407.

Second control circuit 407 measures the time required for the quantitative relationship between potential Vsh of first node n1 and the potential of the ramp signal to be inverted, and generates a second digital signal corresponding to the measured time. The second digital signal is a low-order portion that is remainder of the digital signal that is converted from the analog signal of vertical signal line 11.

Output selection circuit 6 selectively reads out and outputs the first digital signal and the second digital signal generated in each A/D converter 40.

Figure 4:
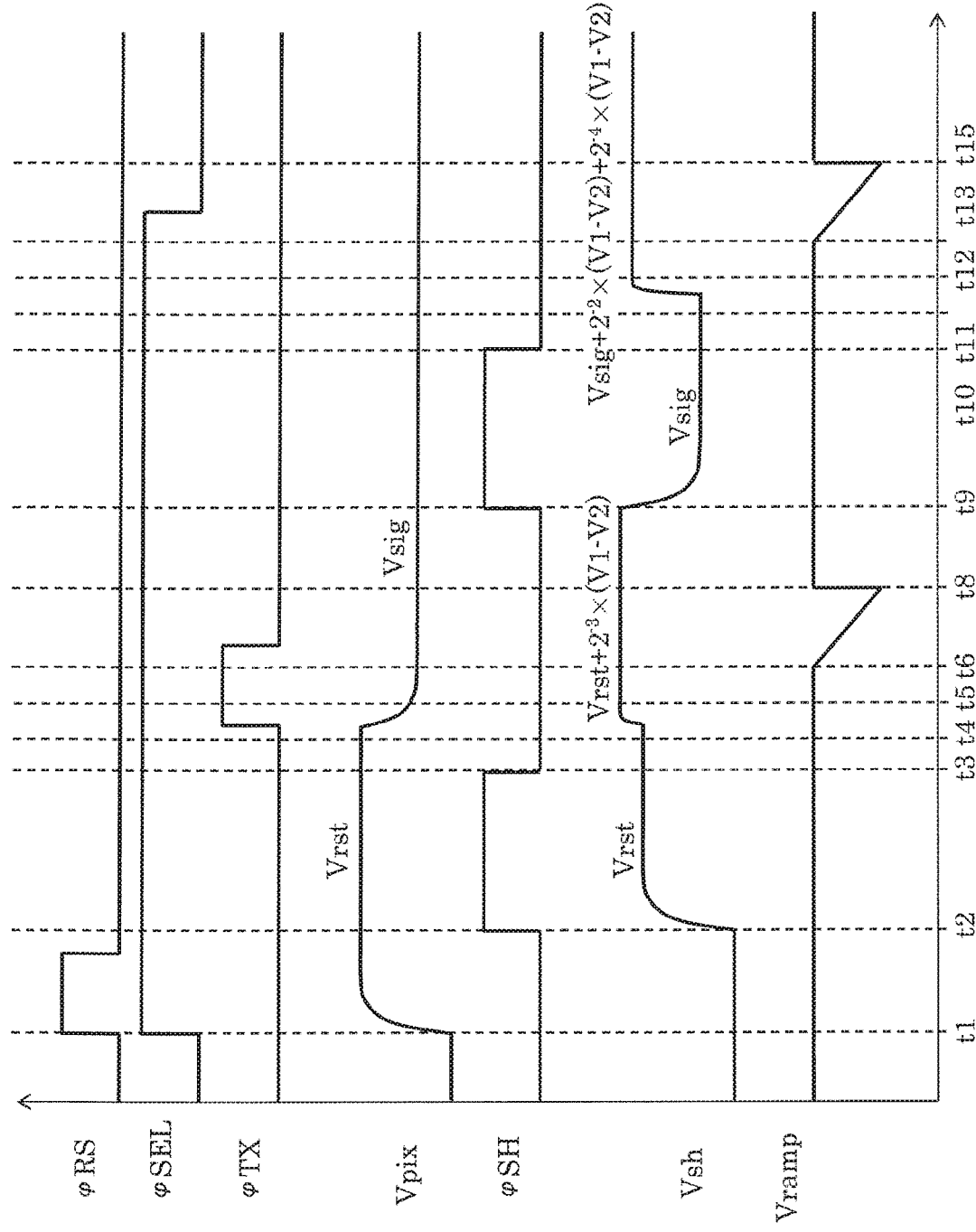
FIG. 4 is an operation timing diagram of the solid-state imaging device according to Embodiment 1.
Figure 5:
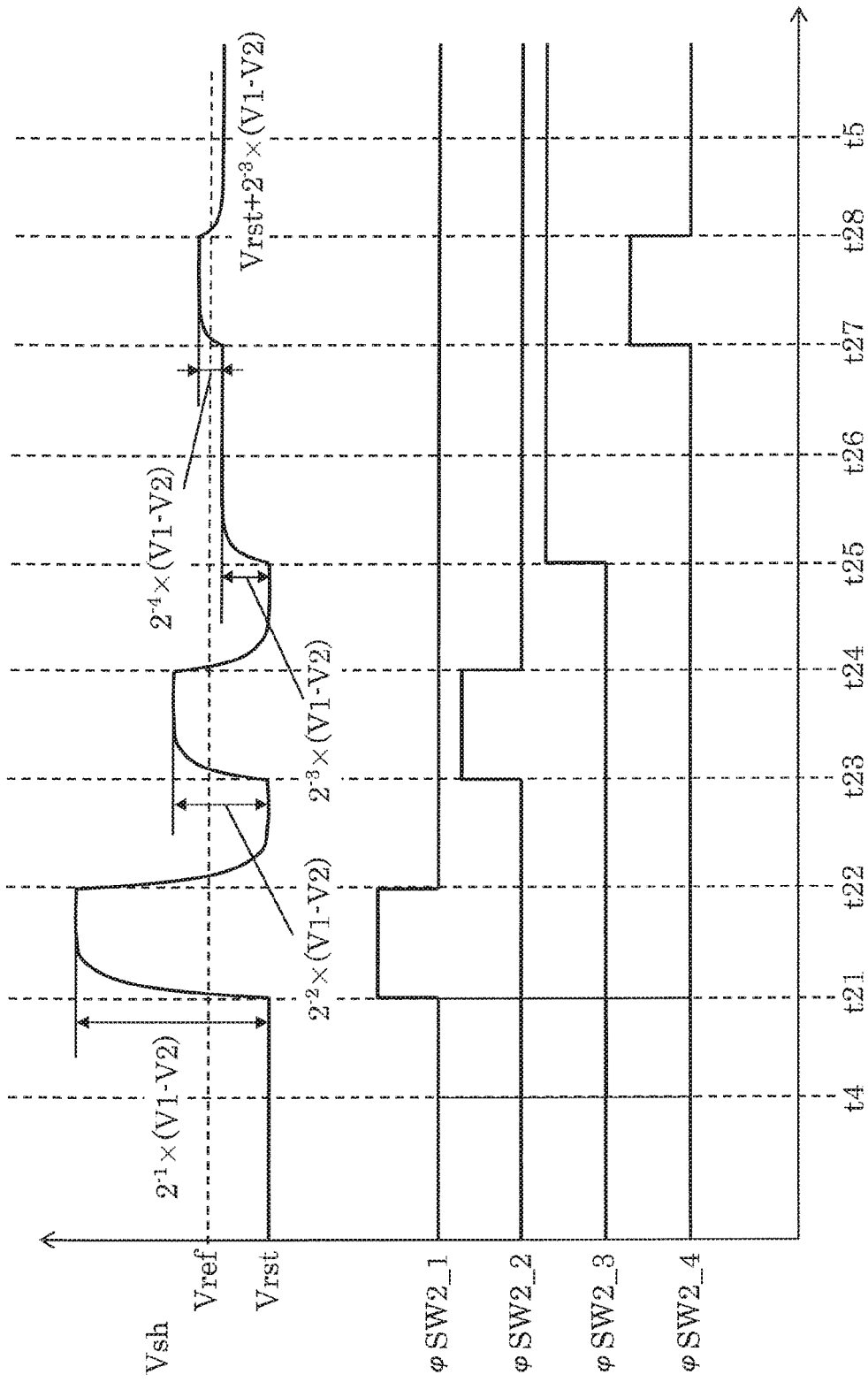
FIG. 5 is an operation timing diagram of the solid-state imaging device according to Embodiment 1.

FIG. 4, FIG. 5, and FIG. 6 are operation timing diagrams of the solid-state imaging device in FIG. 1. However, N in FIG. 3 is 4.

In FIG. 4, FIG. 5, and FIG. 6, the horizontal axis represents the time and the vertical axis represents a potential of each signal. φRS represents a pulse signal that commonly controls reset transistors in a predetermined row. φTX represents a pulse signal that commonly controls transfer transistors in the predetermined row. φSEL represents a pulse signal that commonly controls selection transistors in the predetermined row. $V_{pix}$ represents a potential of vertical signal line 11 connected to a predetermined pixel cell. φSH represents a pulse signal that commonly controls first switches 401. $V_a n$ represents the potential of first node n1 of A/D converter 40 in a predetermined column. $V_{ramp}$ represents a potential of ramp signal line 413. $V_{ref}$ represents a potential of reference signal line 414. $V_1$ (V1 in the drawing) represents the first potential. $V_2$ (V2 in the drawing) represents the second potential. φSW2_1 to φSW2_4 represent a pulse signal that controls the second switches in the predetermined column.

Second switches 408_1 to 408_4 respectively supply second potential $V_2$ to capacitors 400_1 to 400_4 when pulse signals φSW2_1 to φSW2_4, which control second switches 408_1 to 408_4, are at a low level, and respectively supply first potential $V_1$ to capacitors 400_1 to 400_4 when pulse signals φSW2_1 to φSW2_4 are at a high level.

In FIG. 4, when setting φSEL and φRS to a high level at time t1, all selection transistors 105 connected to φSEL and reset transistors 103 connected to φRS are turned on, the potential of FD 101 in the corresponding row is reset, and potential $V_{pix}$ of vertical signal line 11 becomes $V_{rst}$ that represents a reset level.

When setting φSH to a high level at time t2, all first switches 401 connected to φSH are turned on, and the potential of vertical signal line 11 in each column and the potential of first node n1 in each column become equal. Therefore, $V_{sh}$ transitions to $V_{rst}$. By setting φSH to a low level at time t3, $V_{sh}$ is retained by $V_{rst}$.

The first A/D conversion is performed during time t4 and time t5, but detailed description thereof is shown in FIG. 5.

In FIG. 5, when setting φSW2_1 to a high level at time t21, a signal supplied to capacitor 400_1 is switched from second potential $V_2$ to first potential $V_1$. Since φSH1 is at a low level, $V_{sh}$ increases by only $(V_1-V_2)/2$, because the total charge of capacitors 400_0 to 400_N does not change.

When first comparator 404 compares $V_{ref}$ and $V_{sh}$ at time t22 and $V_{sh}$ is higher, first control circuit 406 returns φSW2_1 to a low level, and when $V_{sh}$ is lower, first control circuit 406 maintains φSW2_1 at a high level. Since Vsh is higher here, φSW2_1 returns to a low level, the signal supplied to capacitor 400_1 also returns to second potential $V_2$, and $V_{sh}$ returns to $V_{rst}$.

When setting φSW2_2 to a high level at time t23, $V_{sh}$ increases by only $(V_1-V_2)/2^2$. When first comparator 404 compares $V_{ref}$ and $V_{sh}$ at time t24 and $V_{sh}$ is higher, first control circuit 406 returns φSW2_2 to a low level, and when $V_{sh}$ is lower, first control circuit 406 maintains φSW2_2 at a high level. Since $V_{sh}$ is higher here, φSW2_2 returns to a low level, the signal supplied to capacitor 400_2 also returns to second potential $V_2$, and $V_{sh}$ returns to $V_{rst}$.

When setting φSW2_3 to a high level at time t25, Vsh increases by only $(V_1-V_2)/2^3$. When first comparator 404 compares $V_{ref}$ and $V_{sh}$ at time t26 and Vsh is higher, first control circuit 406 returns φSW2_3 to a low level, and when $V_{sh}$ is lower, first control circuit 406 maintains φSW2_3 at a high level. Since $V_{sh}$ is lower here, φSW2_3 is maintained at a high level, the signal supplied to capacitor 400_3 is also maintained at first potential $V_1$, and $V_{sh}$ is maintained at $V_{rst}+(V_1-V_2)/2^3$.

When setting φSW2_4 to a high level at time t27, $V_{sh}$ increases by only $(V_1-V_2)/2^4$. When first comparator 404 compares $V_{ref}$ and $V_{sh}$ at time t28 and $V_{sh}$ is higher, first control circuit 406 returns φSW2_4 to a low level, and when $V_{sh}$ is lower, first control circuit 406 maintains φSW2_4 at a high level. Since $V_{sh}$ is higher here, φSW2_4 returns to a low level, the signal supplied to capacitor 400_4 also returns to second potential V2, and $V_{sh}$ returns to $V_{rst}+(V_1-V_2)/2^3$.

Upon setting states r1 to r4 of φSW2_1 to φSW2_4 to 0 when each are at a low level and to 1 when each are at a high level, first control circuit 406 outputs, due to the above first A/D conversion operation, first digital signal D1_rst={r1, r2, r3, r4}={0, 0, 1, 0}, and $V_{sh}$ becomes $V_{rst}+(V_1-V_2)/2^3$.

In FIG. 4, $V_{ramp}$ begins a drop at time t6. Second control circuit 407 measures time $T_d$ until time t7 (t7 is not illustrated) at which a quantitative relationship between $V_{sh}$ and $V_{ramp}$ is inverted, and outputs second digital signal D2_rst corresponding to $T_d$. The drop of $V_{ramp}$ stops at time t8.

When setting φTX to a high level between times t3 to t8, all transfer transistors 102 connected to φTX are turned on, electrons produced in photodiode 100 of the corresponding row are transferred to FD 101, and potential $V_{pix}$ of vertical signal line 11 becomes $V_{sig}$ dropped down from $V_{rst}$ by only a potential amount corresponding to the number of transferred electrons.

When setting φSH to a high level at time t9, all first switches 401 connected to φSH are turned on, and potential $V_{pix}$ of vertical signal line 11 in each column and the potential of first node n1 in each column become equal. Therefore, $V_{sh}$ transitions to $V_{sig}$. By setting φSH to a low level at time t10, $V_{sh}$ is retained by $V_{sig}$.

The first A/D conversion is performed during time t11 and time t12, but detailed description thereof is shown in FIG. 6.

Note that it is not illustrated, but SW2_1 to SW2_4 are all reset to a low level between times t8 and t9.

In FIG. 6, when setting φSW2_1 to a high level at time t31, a signal supplied to capacitor 400_1 is switched from second potential $V_2$ to first potential $V_1$, and $V_{sh}$ increases by only $(V_1-V_2)/2$.

When first comparator 404 compares $V_{ref}$ and $V_{sh}$ at time t32 and $V_{sh}$ is higher, first control circuit 406 returns φSW2_1 to a low level, and when $V_{sh}$ is lower, first control circuit 406 maintains φSW2_1 at a high level. Since $V_{sh}$ is higher here, φSW2_1 returns to a low level, the signal supplied to capacitor 400_1 also returns to second potential $V_2$, and $V_{sh}$ returns to $V_{sig}$.

When setting φSW2_2 to a high level at time t33, $V_{sh}$ increases by only $(V_2-V_1)/2^2$. When first comparator 404 compares $V_{ref}$ and $V_{sh}$ at time t34 and $V_{sh}$ is higher, first control circuit 406 returns φSW2_2 to a low level, and when $V_{sh}$ is lower, first control circuit 406 maintains φSW2_2 at a high level. Since $V_{sh}$ is lower here, φSW2_2 is maintained at a high level, the signal supplied to capacitor 400_2 is also maintained at first potential $V_1$, and $V_{sh}$ is maintained at $V_{sig}+(V_1-V_2)/2^2$.

When setting φSW2_3 to a high level at time t35, $V_{sh}$ increases by only $(V_1-V_2)/2^3$. When first comparator 404 compares $V_{ref}$ and $V_{sh}$ at time t36 and $V_{sh}$ is higher, first control circuit 406 returns φSW2_3 to a low level, and when $V_{sh}$ is lower, first control circuit 406 maintains φSW2_3 at a high level. Since $V_{sh}$ is higher here, φSW2_3 returns to a low level, the signal supplied to capacitor 400_3 also returns to second potential $V_2$, and $V_{sh}$ returns to $V_{rst}+(V_1-V_2)/2^2$.

When setting φSW2_4 to a high level at time t37, $V_{sh}$ n increases by only $(V_1-V_2)/2^4$. When first comparator 404 compares $V_{ref}$ and $V_{sh}$ at time t38 and $V_{sh}$ is higher, first control circuit 406 returns φSW2_4 to a low level, and when $V_{sh}$ is lower, first control circuit 406 maintains φSW2_4 at a high level. Since $V_{sh}$ is lower here, φSW2_4 is maintained at a high level, the signal supplied to capacitor 400_4 is also maintained at first potential V1, and $V_{sh}$ is maintained at $V_{rst}+(V_1-V_2)/2^2+(V_1-V_2)/2^4$.

Upon setting states s1 to s4 of φSW2_1 to φSW2_4 to 0 when each are at a low level and to 1 when each are at a high level, first control circuit 406 outputs, due to the above first A/D conversion operation, first digital signal D1_rst={s2, s3, s4}={0, 1, 0, 1}, and $V_{sh}$ becomes $V_{rst}+(V_1-V_2)/2^2+(V_1-V_2)/2^4$.

In FIG. 4, $V_{ramp}$ begins a drop at time t13. Second control circuit 407 measures time Tu until time t14 (t14 is not illustrated) at which the quantitative relationship between $V_{sh}$ and $V_{ramp}$ is inverted, and outputs second digital signal D2_sig corresponding to Tu. The drop of $V_{ramp}$ stops at time t15.

As stated above, first comparator 404 is used in the first A/D conversion during which the first digital signal is obtained through the binary search. Noise from first comparator 404 is superimposed over the first digital signal, but as the above expressions illustrate, the noise is canceled out during the second A/D conversion since the noise is also added to the potential of first node n1, and there is no influence on the ultimately obtained digital conversion value. On the other hand, when the operation speed of first comparator 404 is low, the first A/D conversion ends up requiring more time.

Figure 7A:
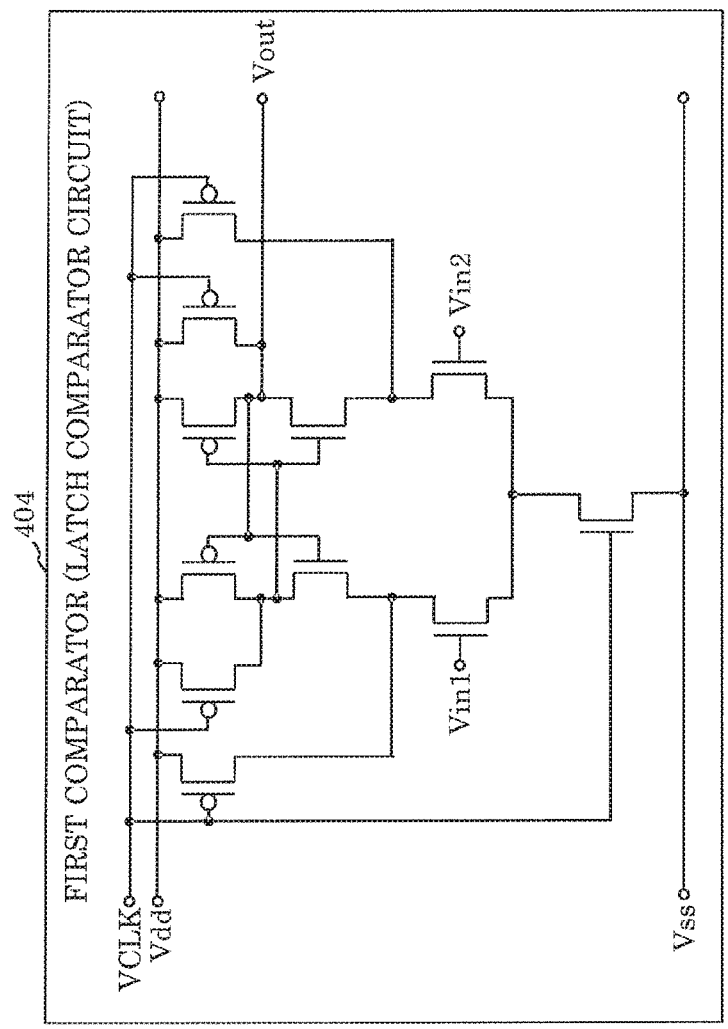
FIG. 7A is a diagram showing a configuration example of a first comparator according to Embodiment 1.
Figure 7B:
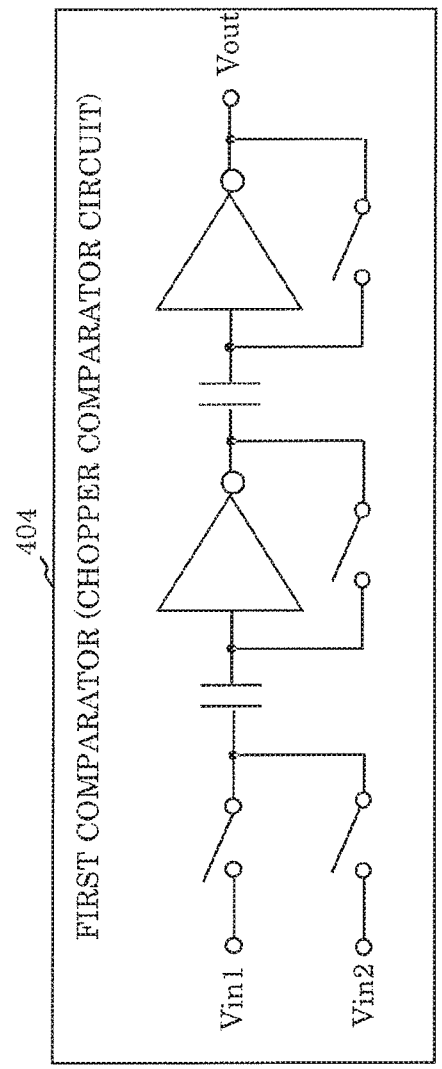
FIG. 7B is a diagram showing another configuration example of the first comparator according to Embodiment 1.

This enables high-speed digital conversion without influencing the A/D conversion precision by using, for example, a high-speed latch comparator circuit as shown in FIG. 7A or a high-speed chopper comparator circuit as shown in FIG. 7B in first comparator 404, because the noise from the first A/D conversion operation does not influence the ultimately obtained digital conversion value.

Figure 7C:
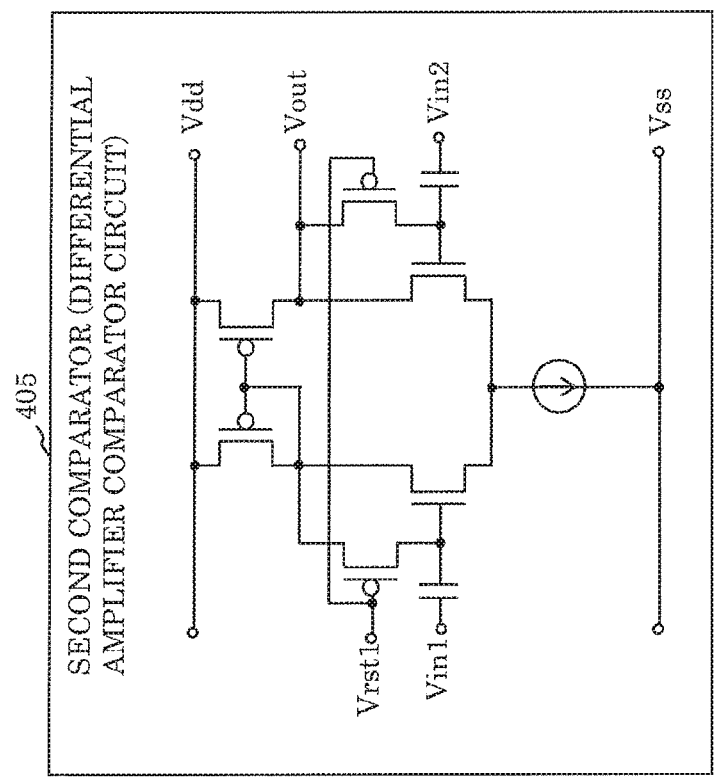
FIG. 7C is a diagram showing a configuration example of a second comparator according to Embodiment 1.
Figure 7D:
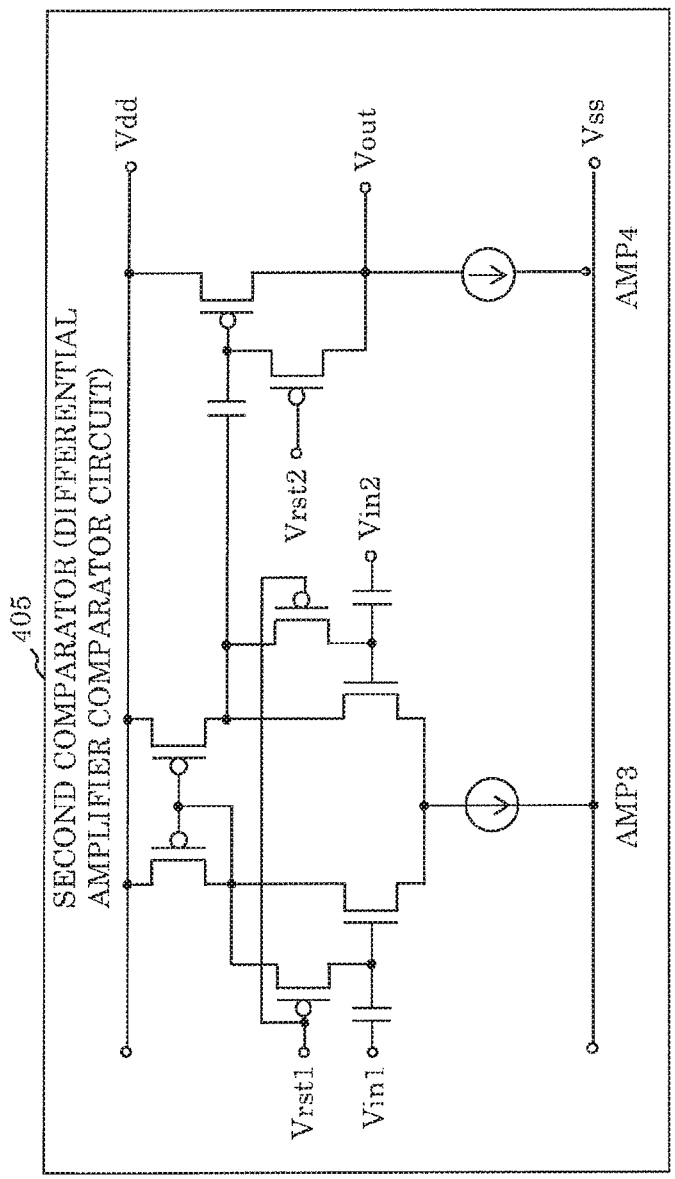
FIG. 7D is a diagram showing another configuration example of the second comparator according to Embodiment 1.

In contrast, the noise from second comparator 405 is superimposed over the second digital signal which causes errors in the A/D conversion. However, the amount of time necessary for the second A/D conversion depends on a clock frequency for measuring the time, and even when the operation speed of the second comparator is low, the amount of time necessary for the second A/D conversion does not increase. Accordingly, a high-precision digital conversion is possible without influencing the A/D conversion speed by using, for example, a low-noise differential amplifier comparator circuit as shown in FIG. 7C and FIG. 7D in second comparator 405.

As described above, in the present embodiment high-order bits are A/D converted using successive approximation and low-order bits using single slope A/D conversion during the A/D conversion. The comparator used for the successive approximation A/D conversion and the comparator used for the single slope A/D conversion are different components. It is possible to perform a low-noise, high-resolution A/D conversion at a high speed and implement a high-quality image sensor with a high frame rate by using a comparator that operates at a high speed during the successive approximation A/D conversion and a comparator that limits noise contamination during the single slope A/D conversion.

Note that pixel cell 10 in FIG. 2 has a so-called one pixel per cell structure including photodiode 100, transfer transistor 102, FD 101, reset transistor 103, readout transistor 104, and selection transistor 105. Not being limited to the foregoing, pixel cell 10 can include multiple pixels (i.e., photodiodes 100), and further have a so-called multiple pixels per cell structure in which any or each of FD 101, reset transistor 103, readout transistor 104, and selection transistor 105 are shared within one pixel cell. In other words, in pixel cell 10 in FIG. 2, one of each of reset transistor 103, readout transistor 104, and selection transistor 105 is disposed are one pixel (i.e. photodiode 100), but it is possible to substantially reduce the number of transistors per pixel when reset transistor 103, readout transistor 104, and selection transistor 105 are shared between multiple neighboring pixels cells.

The solid-state imaging device in FIG. 1 can have (i) a structure in which pixels are disposed on the same surface as the front surface of a semiconductor substrate, i.e., surface on which gate terminals and wiring of the transistors are formed, and also (ii) a so-called back-illuminated image sensor (back-illuminated solid-state imaging device) structure in which pixels are disposed on a rear surface of a semiconductor substrate, i.e. rear side surface on which gate terminals and wiring of the transistors are formed.

Figure 8A:
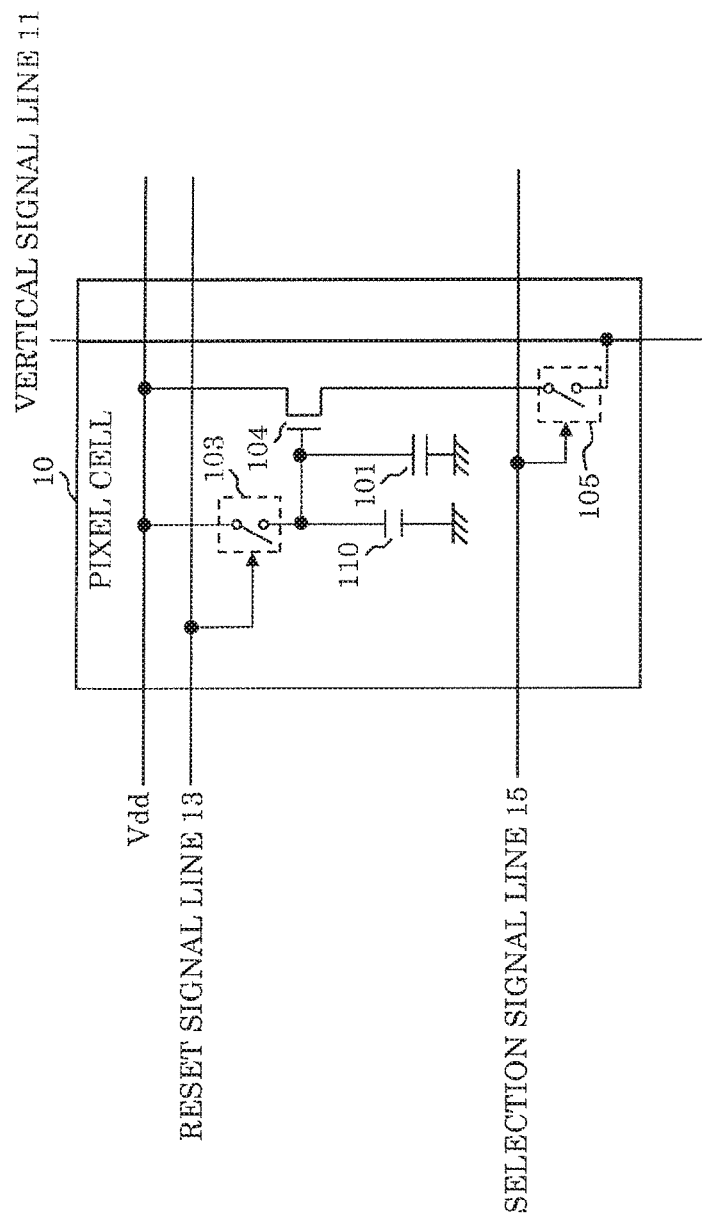
FIG. 8A is a diagram showing another configuration example of the pixel cell according to Embodiment 1.

Additionally, as illustrated in FIG. 8A, the solid-state imaging device can also have an image sensor structure using a photoelectric conversion film (to give an example, a photoelectric conversion film that uses organic material).

Figure 8B:
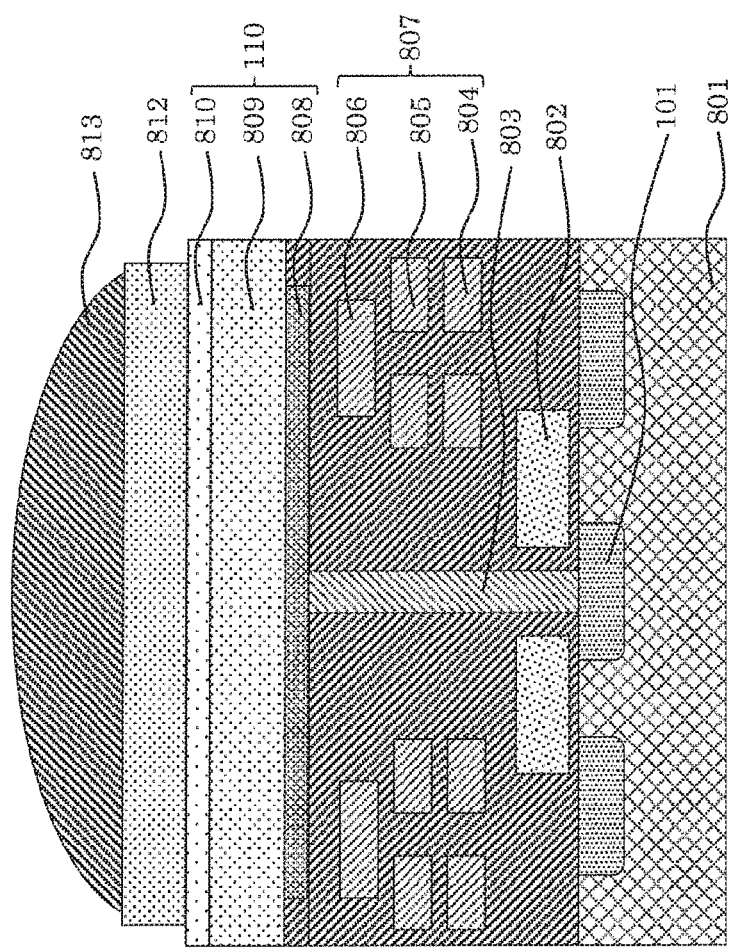
FIG. 8B is a cross-sectional view of the other configuration example of the pixel cell according to Embodiment 1.

In the case of the image sensor structure that uses photoelectric conversion film 110, the image sensor includes transparent electrode 810, pixel electrode 808, and photoelectric conversion layer 809 interposed therebetween, as illustrated in the cross-sectional view in FIG. 8B. FIG. 8B is a cross-sectional view of another configuration example of the pixel cell according to Embodiment 1. The pixel cell in FIG. 8B includes semiconductor substrate 801, gate electrode 802, contact plug 803, wiring layer 807, photoelectric conversion film 110, color filter 812, and on-chip lens 813. FD 101 is disposed in semiconductor substrate 801 and is electrically connected to pixel electrode 808 via contact plug 803. Light is radiated on the above photoelectric conversion layer 809, an electric field is produced when a bias potential is applied between transparent electrode 810 and pixel electrode 808, one of positive and negative charge produced through photoelectric conversion is collected by pixel electrode 808, and the collected charge is accumulated in FD 101. Reading out the charge accumulated in FD 101 is fundamentally the same as with the photodiode in FIG. 2.

A pixel circuit example without transfer transistor is shown in FIG. 8B, but can also include a transfer transistor.

In the present example, $V_{ref}$ is a reference potential, but can also be a potential that is output from the pixel cell when there is no light radiation. In this case, D1_rst is {0, 0, 0, 0} even when the operations from times t21 to t28 are performed, and since $V_{sh}$ becomes $V_{rst}$ at time t28, the operations from time t21 to time t28 may be omitted.

As described above, the solid-state imaging device according to Embodiment 1 includes pixel cells 10 arranged in the X-direction and the Y-direction, pixel cells 10 each including a photoelectric converter that converts an optical signal to an electrical signal; vertical signal lines 11 arranged in the X-direction that are connected to pixel cells 10 and transmit the electrical signal as an analog signal; and A/D converters 40 arranged in the X-direction that are respectively connected to vertical signal lines 11 and convert the analog signal to a digital signal. A/D converters 40 each include first A/D converter circuit 41 having first comparator 404; and second A/D converter circuit 42 having second comparator 405. First A/D converter circuit 41 performs a first A/D conversion that (i) refines, using first comparator 404, a range including a potential of the analog signal through a binary search, and (ii) generates, based on a result of the binary search, a first digital signal being a high-order portion of the digital signal. Second A/D converter circuit 42 performs a second A/D conversion that generates a second digital signal being a low-order portion that is a remainder of the digital signal by measuring a time required for an output of second comparator 405 to be inverted, second comparator 405 comparing a quantitative relationship between the analog signal refined and a ramp signal.

This simplifies implementing high-speed A/D conversion and a high-resolution solid-state imaging device with a high frame rate while limiting noise contamination.

First comparator 404 may be faster than second comparator 405, and second comparator 405 may be more resistant to noise contamination than first comparator 404.

This further simplifies implementing a high-speed A/D conversion while limiting noise contamination.

First A/D converter circuit 41 may include first control circuit 406 that performs a control to (i) refine, based on an output of first comparator 404, the range including the potential of the analog signal through the binary search, and (ii) generate, based on the result of the binary search, the first digital signal. Second A/D converter circuit 42 may include second control circuit 407 that performs a control to (i) measure the time necessary for the output of second comparator 405 to be inverted, and (ii) generate the second digital signal corresponding to the time measured.

This makes it possible to speed up the first A/D conversion (so-called SAR conversion) and limit noise with the second A/D conversion (so-called SS conversion).

First A/D converter circuit 41 may include capacitors 400_1 to 400_N coupled to first node n1; first switch 401 disposed between vertical signal lines 11 and first node n1; first signal line S1 having first potential V1; second signal line S2 having second potential V2; second switches 408_1 to 408_N that are respectively connected to capacitors 400_1 to 400_N, second switches 408_1 to 408_N selectively connecting a corresponding one of capacitors 400_1 to 400_N to first signal line S1 or second signal line S2; first comparator 404 connected to first node n1; reference signal line 414 connected to first comparator 404; and first control circuit 406 connected to the output of first comparator 404. Second A/D converter circuit 42 may include second comparator 405 connected to first node n1; ramp signal line 413 connected to second comparator 405; and second control circuit 407 connected to the output of second comparator 405. Capacitors 400_1 to 400_N may retain the potential corresponding to the analog signal via first switch 401.

The solid-state imaging device may perform the second A/D conversion after the first A/D conversion.

First comparator 404 and second comparator 405 may have a different configuration.

First comparator 404 may be a latch comparator circuit.

First comparator 404 may be a chopper comparator circuit.

Second comparator 405 may be a differential amplifier comparator circuit.

The photoelectric converter may include a photoelectric conversion film.

Embodiment 2

The solid-state imaging device according to Embodiment 2 will be described with reference to FIG. 9 and FIG. 10.

Figure 9:
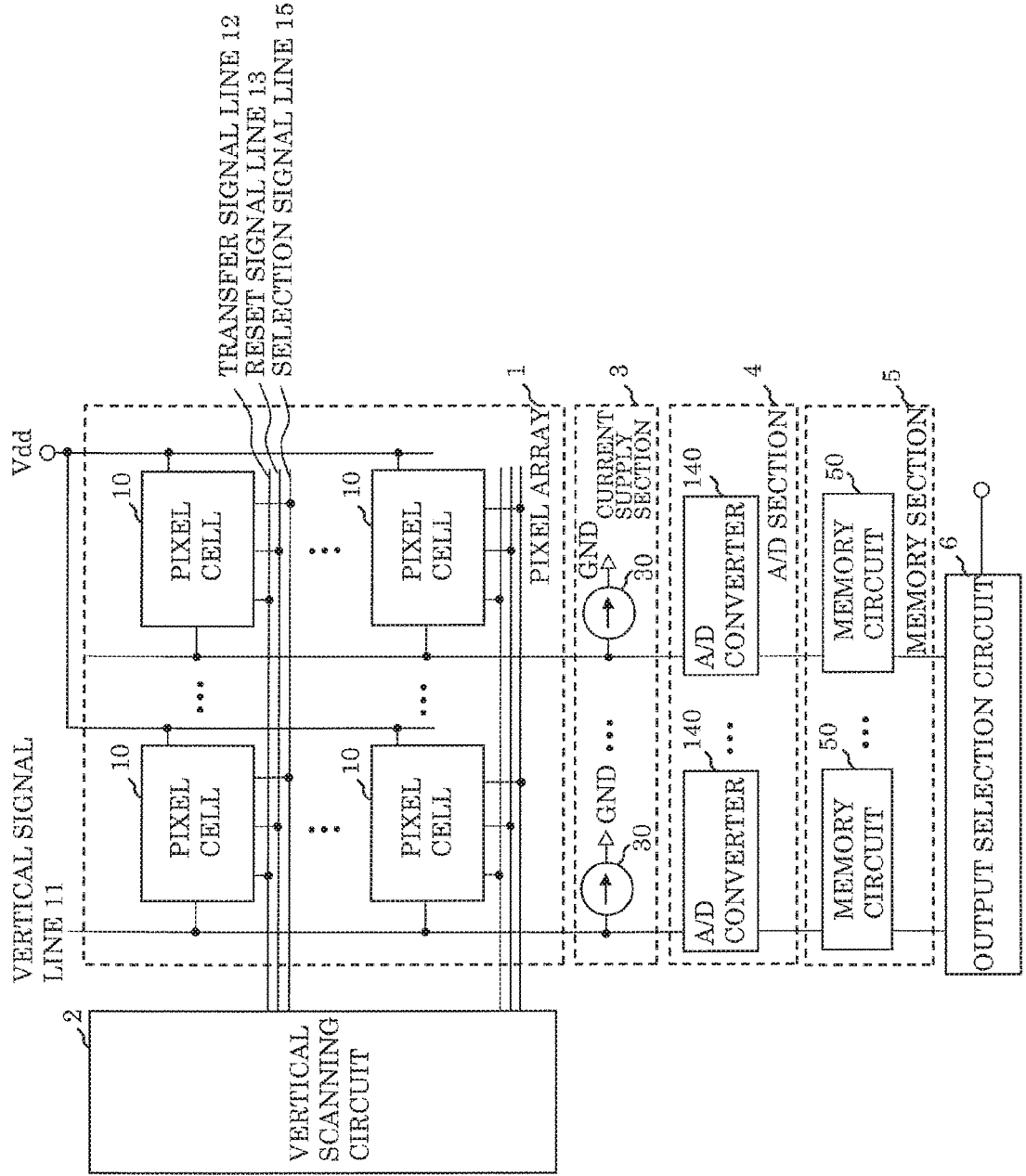
FIG. 9 is a diagram showing a configuration example of the solid-state imaging device according to Embodiment 2.

FIG. 9 is a diagram showing a configuration example of the solid-state imaging device according to Embodiment 2. The solid-state imaging device in FIG. 9 differs from the solid-state imaging device in FIG. 1 in that the solid-state imaging device in FIG. 9 includes A/D converter 140 instead of A/D converter 40 in A/D section 4. Hereinafter, differences with the solid-state imaging device in FIG. 1 will by mainly described.

Figure 10:
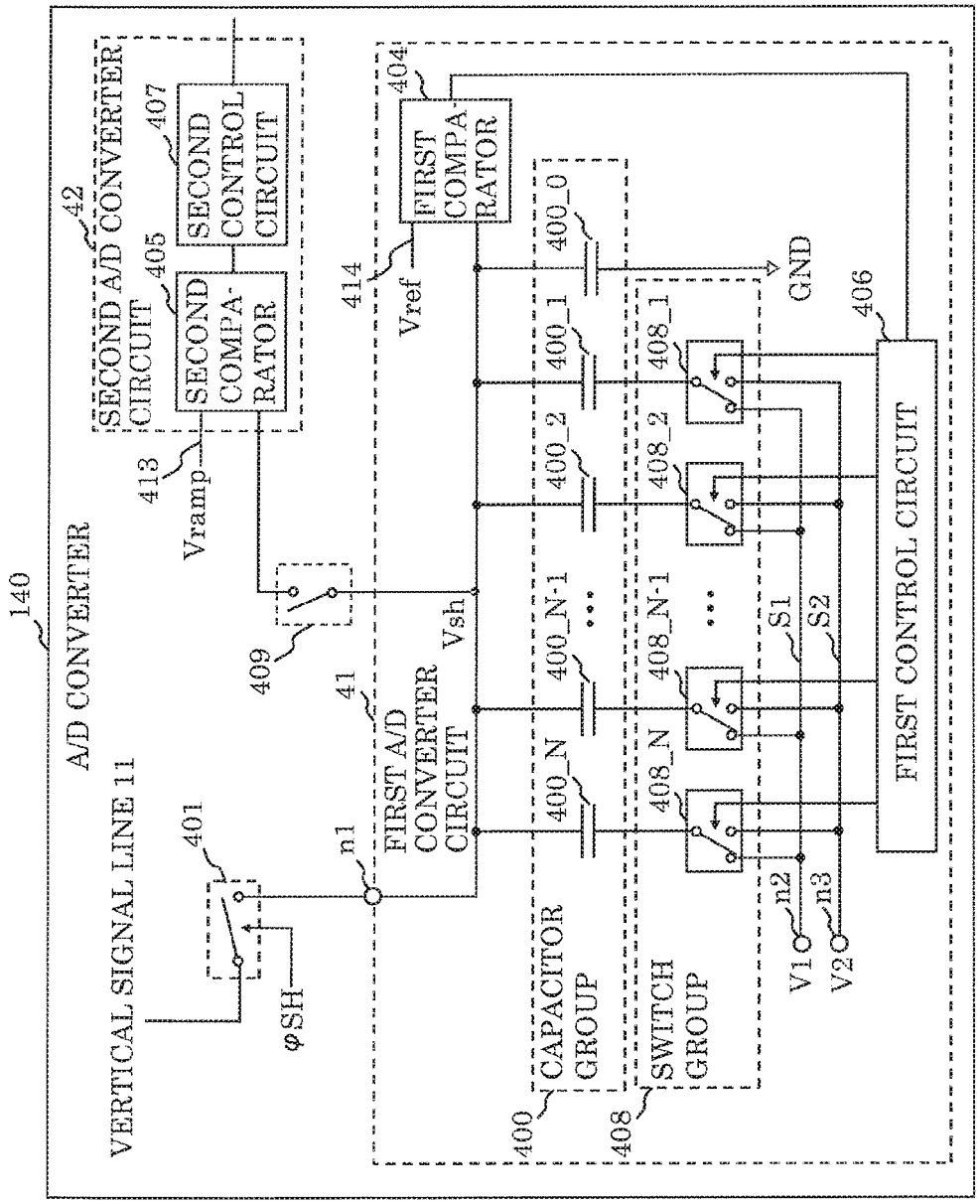
FIG. 10 is a diagram showing a configuration example of the an A/D converter according to Embodiment 2.

FIG. 10 is a diagram showing a configuration example of A/D converter 140 according to the present embodiment. A/D converter 140 in FIG. 10 differs from A/D converter 40 in FIG. 3 in that third switch 409 has been added.

Third switch 409 is inserted between first node n1 and second comparator 405. When turned on, third switch 409 transmits the potential of first node n1 to second comparator 405, and when turned off, disconnects second comparator 405 and first node n1.

The second comparator compares the quantitative relationship between the potential of first node n1 and the potential of the ramp signal when at least the third switch is turned on, and outputs this result to the second control circuit.

An operation of the solid-state imaging device according to the present embodiment is roughly the same as the operation shown as the operation timing diagrams of the solid-state imaging device in Embodiment 1 shown in FIG. 4, FIG. 5, and FIG. 6, but third switch 409 is turned off for at least the period of times t4 and t5 in FIG. 4. With this, not only a load of the second comparator is disconnected during the first A/D conversion, but also a wiring load for connection to second comparator 405. Column circuits in solid-state imaging devices generally have a width of several μm, but wiring and wiring loads are often longer. By turning off third switch 409 during the first A/D conversion, the wiring charge that is parasitic to first node n1 becomes smaller and a potential change of first node n1 becomes faster. In other words, the first A/D conversion time becomes shorter.

In the present embodiment, it is therefore possible to reduce the time necessary for the first A/D conversion, and to implement an even faster A/D conversion and a high-quality solid-state image sensor with a high frame rate.

Note that similar to Embodiment 1, pixel cell 10 in FIG. 9 does not need to have a one pixel per cell structure, and may also have a multiple pixels per cell structure.

The solid-state imaging device in FIG. 9 can also be a back-illuminated solid-state imaging device.

Additionally, pixel cell 10 in FIG. 9 can also have the image sensor structure using a photoelectric conversion film (to give an example, a photoelectric conversion film that uses organic material) shown in FIG. 8A and FIG. 8B.

As described above, in the solid-state imaging device according to Embodiment 2, first A/D converter circuit 41 includes capacitors 400_1 to 400_N coupled to first node n1; first switch 401 disposed between vertical signal lines 11 and first node n1; first signal line S1 having the first potential; second signal line S2 having the second potential; second switches 408_1 to 408_N that are respectively connected to capacitors 400_1 to 400_N, second switches 408_1 to 408_N selectively connecting a corresponding one of capacitors 400_1 to 400_N to first signal line S1 or second signal line S2; first comparator 404 connected to first node n1; reference signal line 414 having a reference potential and being connected to first comparator 404; and first control circuit 406 connected to the output of first comparator 404. Second A/D converter circuit 42 includes second comparator 405 connected to first node n1 via third switch 409; ramp signal line 413 connected to second comparator 405; and second control circuit 407 connected to the output of second comparator 405. First switch 401 retains the potential corresponding to the analog signal via first switch 401.

With this, by turning off third switch 409 during the first A/D conversion, the wiring charge that is parasitic to first node n1 becomes smaller and the potential change of first node n1 becomes faster due to the operation of the second switch. In other words, the first A/D conversion can be sped up.

Third switch 409 may electrically disconnect first node n1 and second comparator 405 during the first A/D conversion.

Embodiment 3

The solid-state imaging device according to Embodiment 3 will be described with reference to FIG. 11 and FIG. 12.

Figure 11:
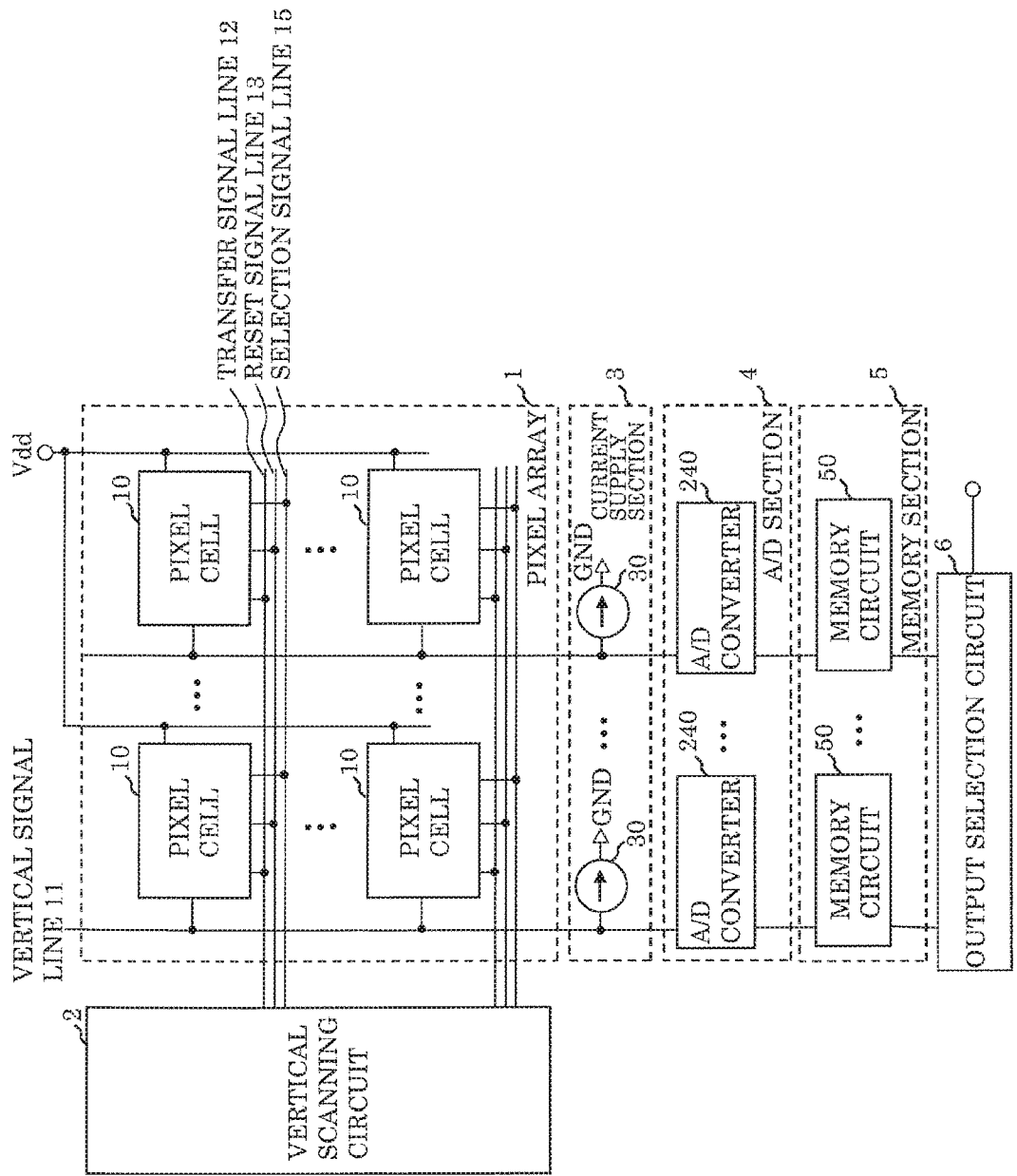
FIG. 11 is a diagram showing a configuration example of the solid-state imaging device according to Embodiment 3.

FIG. 11 is a diagram showing a configuration example of the solid-state imaging device according to Embodiment 3. The solid-state imaging device in FIG. 11 differs from the solid-state imaging device in FIG. 1 in that the solid-state imaging device in FIG. 11 includes A/D converter 240 instead of A/D converter 40 in A/D section 4. Hereinafter, differences with the solid-state imaging device in FIG. 1 will by mainly described.

Figure 12:
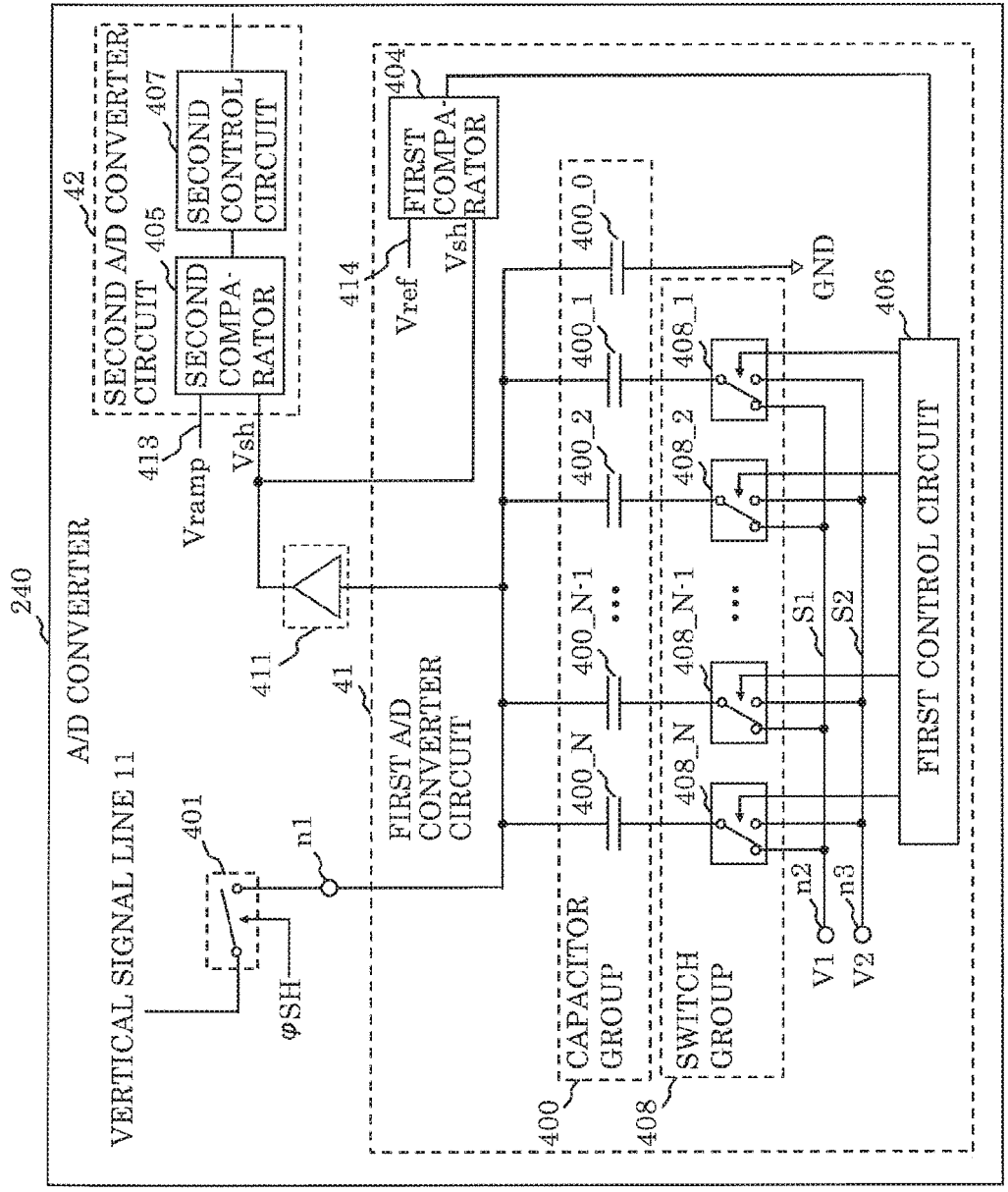
FIG. 12 is a diagram showing a configuration example of an A/D converter according to Embodiment 3.

FIG. 12 is a diagram showing a configuration example of A/D converter 240 according to Embodiment 3. A/D converter 240 in FIG. 12 differs from A/D converter 40 in FIG. 3 in that buffer circuit 411 has been added.

Buffer circuit 411 is inserted between first node n1, first comparator 404, and second comparator 405, buffers the analog signal retained by first node n1, and transmits the analog signal to first comparator 404 and second comparator 405.

First comparator 404 is connected to buffer circuit 411, compares a quantitative relationship between an output of buffer circuit 411 and the reference potential, and outputs this result to first control circuit 406.

Second comparator 405 is connected to buffer circuit 411, compares a quantitative relationship between a potential of a signal output from buffer circuit 411 and the potential of the ramp signal, and outputs this result to second control circuit 407.

Second control circuit 407 measures the time required for a quantitative relationship between a potential of the signal output from buffer circuit 411 and the potential of the ramp signal to be inverted, and generates the second digital signal corresponding to the measured time.

An operation of the solid-state imaging device according to the present embodiment is roughly the same as the operation shown as the operation timing diagrams of the solid-state imaging device in Embodiment 1 shown in FIG. 4, FIG. 5, and FIG. 6, but a capacitive load parasitic to first node n1 is considerably reduced by disposing buffer circuit 411 between first comparator 404 and second comparator 405. The capacitive load parasitic to first node n1 not only causes the time necessary for the first A/D conversion to increase, but also causes errors in a capacitance ratio when switching the capacitance during the first A/D conversion, and hinders high-precision A/D conversion. By inserted the buffer circuit and reducing the capacitive load parasitic to first node n1, it is possible to reduce errors in the capacitance ratio when switching the capacitance, and increase the precision of the A/D conversion.

In the present embodiment, it is, therefore, possible to reduce errors during the first A/D conversion, implement A/D conversion with even higher precision, and implement a high-quality image sensor with a high frame rate.

Figure 13:
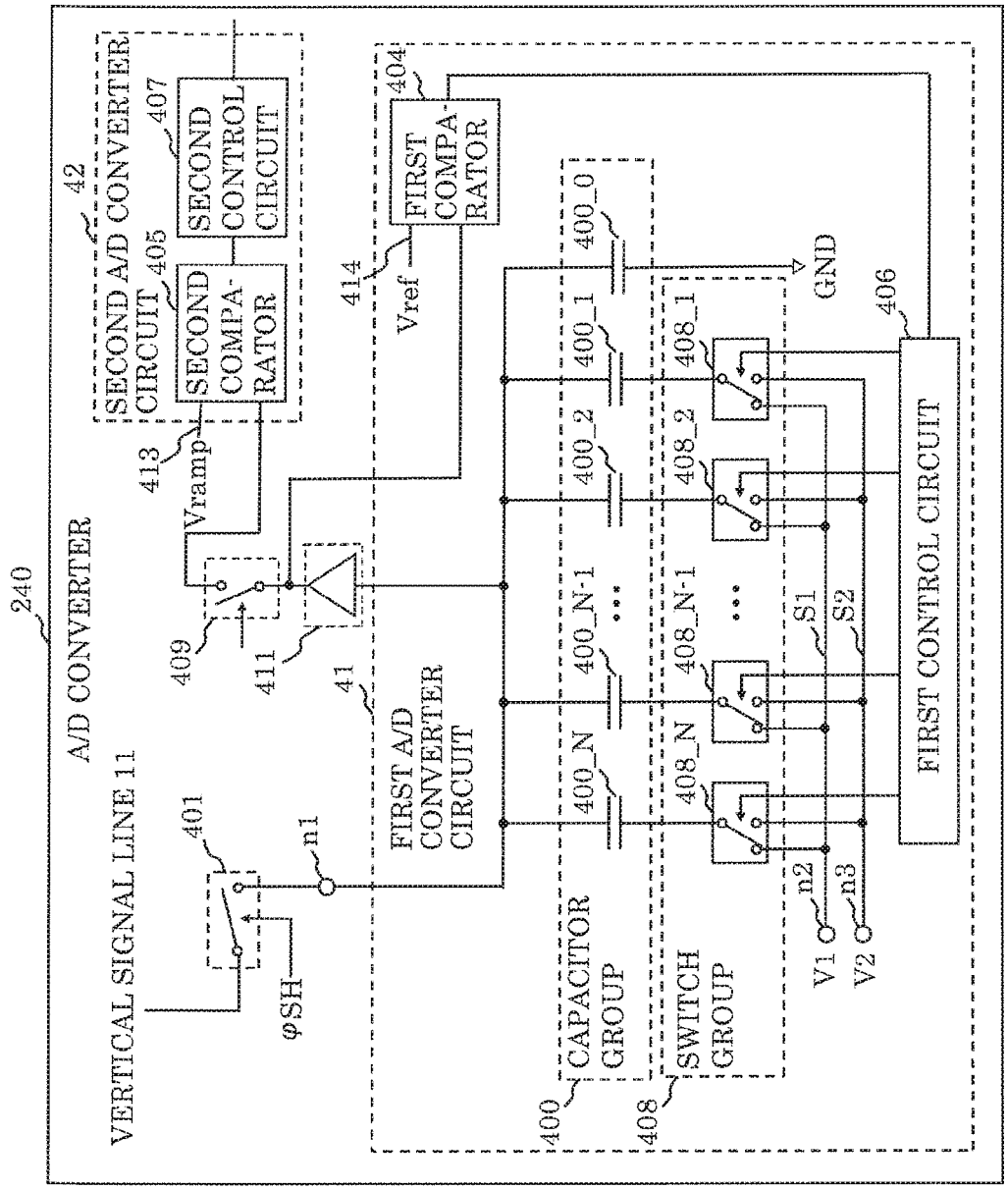
FIG. 13 is a diagram showing a configuration example of the A/D converter according to Embodiment 3.

Note that third switch 409 may be disposed between buffer circuit 411 and second comparator 405, and may be turned off during the first A/D conversion, as illustrated in FIG. 13.

Figure 14:
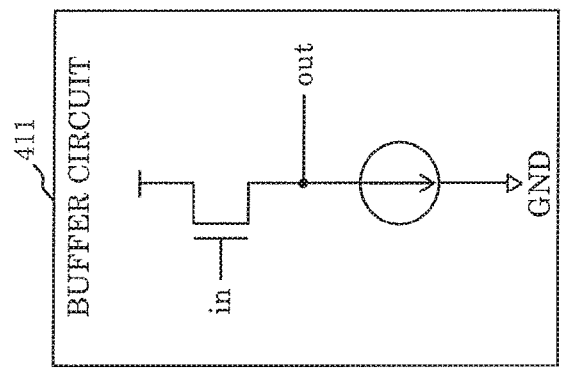
FIG. 14 is a diagram showing a configuration example of a buffer circuit according to Embodiment 3.

As illustrated in FIG. 14, buffer circuit 411 may be a source follower circuit.

As described above, the solid-state imaging device according to Embodiment 3 includes buffer circuit 411 disposed between first node n1 and second comparator 405.

Since the wiring load from first node n1 to the second comparator becomes smaller during the first A/D conversion depending on the presence of buffer circuit 411, the wiring load parasitic to first node n1 becomes smaller, and it is possible to further speed up the first A/D conversion.

The solid-state imaging device according to Embodiment 3 may include buffer circuit 411 disposed between first node n1 and third switch 409.

Buffer circuit 411 may be a source follower circuit.

Embodiment 4

Figure 15:
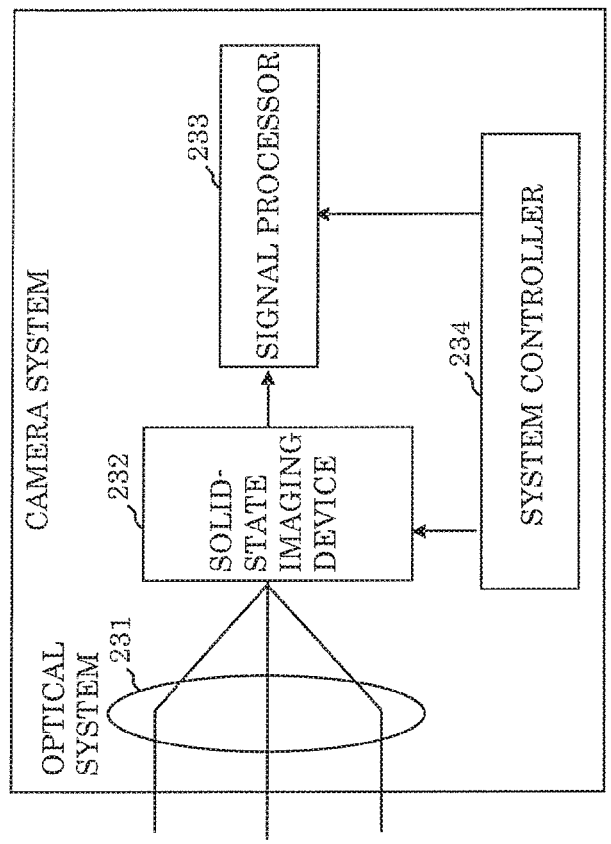
FIG. 15 is a diagram showing a configuration example of a camera system according to Embodiment 4.

A camera system according to Embodiment 4 will be described. FIG. 15 shows an example of a configuration of the camera system included in a solid-state imaging device according to Embodiment 4.

The camera system includes optical system 231, solid-state imaging device 232, signal processor 233, and system controller 234.

Optical system 231 includes at least one lens.

Solid-state imaging device 232 is any of the solid-state imaging devices in the above Embodiments 1 to 3.

Signal processor 233 signal processes data recorded by solid-state imaging device 232, and outputs the recorded data as an image or data.

System controller 234 controls solid-state imaging device 232, signal processor 233, etc.

The camera system in the present embodiment makes it possible to implement a high-speed A/D conversion and enables high-quality imaging at a high frame rate while limiting noise by using any of the solid-state imaging devices in the above embodiments (Embodiments 1 to 3). High-speed and high-precision sensor imaging is, therefore, possible, and as a result, it is possible to provide a camera system with good image properties.

As described above, the camera system according to Embodiment 4 includes any of the solid-state imaging devices described in Embodiments 1 to 3.

This makes it possible to implement a high-speed A/D conversion and enables high quality imaging at a high frame rate while limiting noise.

INDUSTRIAL APPLICABILITY

The present disclosure can be suitably used for a solid-state imaging device and a camera.

The invention claimed is:

1. A solid-state imaging device, comprising:
a plurality of pixel cells arranged in an X-direction and a Y-direction, the plurality of pixels cells each including a photoelectric converter that converts an optical signal to an electrical signal;
a plurality of vertical signal lines arranged in the X-direction that are connected to the plurality of pixel cells and transmit the electrical signal as an analog signal; and
a plurality of analog-to-digital (A/D) converters arranged in the X-direction that are respectively connected to the plurality of vertical signal lines and convert the analog signal to a digital signal, wherein
the plurality of A/D converters each include:
a first A/D converter circuit having a first comparator; and
a second A/D converter circuit having a second comparator,
the first A/D converter circuit performs a first A/D conversion that (i) refines, using the first comparator, a range including a potential of the analog signal through a binary search, and (ii) generates, based on a result of the binary search, a first digital signal being a high-order portion of the digital signal, and
the second A/D converter circuit performs is a second A/D conversion that generates a second digital signal being a low-order portion that is a remainder of the digital signal by measuring a time required for an output of the second comparator to be inverted, the second comparator comparing a quantitative relationship between the analog signal refined and a ramp signal.

2. The solid-state imaging device according to claim 1, wherein
the first comparator is faster than the second comparator, and
the second comparator is more resistant to noise contamination than the first comparator.

3. The solid-state imaging device according to claim 1, wherein
the first A/D converter circuit includes a first control circuit that performs a control to (i) refine, based on an output of the first comparator, the range including the potential of the analog signal through the binary search, and (ii) generate, based on the result of the binary search, the first digital signal, and
the second A/D converter circuit includes a second control circuit that perfou is a control to (i) measure the time necessary for the output of the second comparator to be inverted, and (ii) generate the second digital signal corresponding to the time measured.

4. The solid-state imaging device according to claim 1, wherein
the first A/D converter circuit includes:
a plurality of capacitors coupled to a first node;
a first switch disposed between the plurality of vertical signal lines and the first node;
a first signal line having a first potential;
a second signal line having a second potential;
a plurality of second switches that are respectively connected to the plurality of capacitors, the plurality of second switches selectively connecting a corresponding one of the plurality of capacitors to the first signal line or the second signal line;
the first comparator connected to the first node;
a reference signal line connected to the first comparator; and
a first control circuit connected to an output of the first comparator,
the second A/D converter circuit includes:
the second comparator connected to the first node;
a ramp signal line connected to the second comparator; and
a second control circuit connected to the output of the second comparator, and
the plurality of capacitors retain the potential corresponding to the analog signal via the first switch.

5. The solid-state imaging device according to claim 4, comprising:
a buffer circuit disposed between the first node and the second comparator.

6. The solid-state imaging device according to claim 1, wherein
the first A/D converter circuit includes:
a plurality of capacitors coupled to a first node;
a first switch disposed between the plurality of vertical signal lines and the first node;
a first signal line having a first potential;
a second signal line having a second potential;
a plurality of second switches that are respectively connected to the plurality of capacitors, the plurality of second switches selectively connecting a corresponding one of the plurality of capacitors to the first signal line or the second signal line;
the first comparator connected to the first node;
a reference signal line having a reference potential and being connected to the first comparator; and
a first control circuit connected to an output of the first comparator,
the second A/D converter circuit includes:
the second comparator connected to the first node via a third switch;

a ramp signal line connected to the second comparator; and a second control circuit connected to the output of the second comparator, and the first node retains the potential corresponding to the analog signal via the first switch.

7. The solid-state imaging device according to claim 6, wherein the third switch electrically disconnects the first node and the second comparator during the first A/D conversion.

8. The solid-state imaging device according to claim 7, comprising:

a buffer circuit disposed between the first node and the third switch.

9. The solid-state imaging device according to claim 5, wherein the buffer circuit is a source follower circuit.

10. The solid-state imaging device according to claim 1, wherein the second A/D conversion is performed after the first A/D conversion.

11. The solid-state imaging device according to claim 1, wherein the first comparator and the second comparator have a different configuration.

12. The solid-state imaging device according to claim 1, wherein the first comparator is a latch comparator circuit.

13. The solid-state imaging device according to claim 1, wherein the first comparator is a chopper comparator circuit.

14. The solid-state imaging device according to claim 1, wherein the second comparator is a differential amplifier comparator circuit.

15. The solid-state imaging device according to claim 1, wherein the photoelectric converter includes a photoelectric conversion film.

16. A camera system, comprising:

the solid-state imaging device according to claim 1.

* * * * *